United States Patent [19]
Joyner

[11] Patent Number: 6,057,214
[45] Date of Patent: *May 2, 2000

[54] SILICON-ON-INSULATION TRENCH ISOLATION STRUCTURE AND METHOD FOR FORMING

[75] Inventor: Keith A. Joyner, Richardson, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/987,408

[22] Filed: Dec. 9, 1997

Related U.S. Application Data

[60] Provisional application No. 60/032,640, Dec. 9, 1996.

[51] Int. Cl.[7] .................................................. H01L 21/36
[52] U.S. Cl. ......................... 438/506; 438/370; 438/221; 438/424
[58] Field of Search ..................... 257/510, 506; 438/406, 407, 424, 506, 154, 370, 221

[56] References Cited

U.S. PATENT DOCUMENTS

| | | | |
|---|---|---|---|
| 3,725,146 | 4/1973 | Roder | 257/506 |
| 4,106,954 | 8/1978 | De Brebisson et al. | 438/370 |
| 4,683,637 | 8/1987 | Varker et al. | 257/506 |
| 4,875,086 | 10/1989 | Malhi et al. | 257/506 |
| 5,017,998 | 5/1991 | Miura | 257/510 |
| 5,065,217 | 11/1991 | Verret | 257/506 |
| 5,137,837 | 8/1992 | Chang et al. | 438/154 |
| 5,223,736 | 6/1993 | Rodder | 257/506 |
| 5,364,800 | 11/1994 | Joyner | 437/28 |
| 5,485,030 | 1/1996 | Terashima | 257/506 |
| 5,494,846 | 2/1996 | Yamazaki | 438/407 |
| 5,548,149 | 8/1996 | Joyner | 257/347 |
| 5,616,512 | 4/1997 | Ronsisvalle | 438/406 |
| 5,702,957 | 12/1997 | Padmanabhan | 438/407 |
| 5,733,383 | 3/1998 | Fazan et al. | 438/424 |
| 5,874,346 | 2/1999 | Fulford et al. | 438/221 |
| 5,880,002 | 3/1999 | Hutter et al. | 438/370 |

OTHER PUBLICATIONS

Stanley Wolf Silicon Processing for the VSLI Era vol. 2 Lattice Press p. 53, 1990.

Nov. 1990 Solid State Technology "The Status of SIMOX Technology", pp. 75–78 (Michael A. Guerra, IBIS Technology Corporation, Danvers, Massachusetts).

Materials Science and Engineering (1992) "Defects in SIMOX Structures: Some Process Dependence", pp. 27–36, (J. Margail, J.M. Lamure and A.M. Papon).

*Primary Examiner*—Charles Bowers
*Assistant Examiner*—David S Blum
*Attorney, Agent, or Firm*—Jacqueline J. Garner; Wade James Brady, III; Frederick J. Telecky, Jr.

[57] ABSTRACT

A silicon-on-insulator trench isolation structure is disclosed that includes an active silicon-on-insulator region, an active bulk substrate region, and a trench region positioned between the active silicon-on-insulator region and the active bulk substrate region. The active silicon-on-insulator region is provided with a silicon-on-insulator film (42) positioned above a buried insulator layer (32). The active bulk substrate region may be provided between two trench regions such as a trench region (20) and a trench region (22). The trench region (20) is positioned between the active silicon-on-insulator region and the active bulk substrate region.

15 Claims, 1 Drawing Sheet

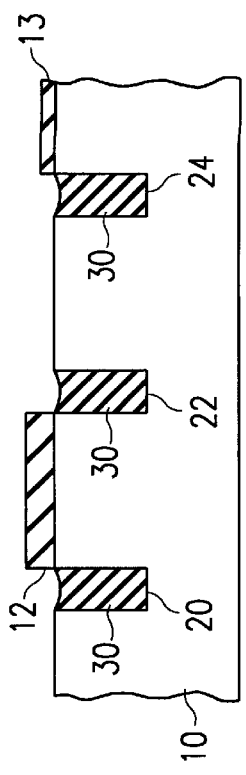
FIG. 1A
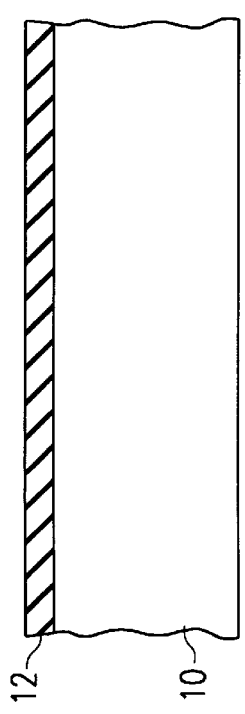
FIG. 1B
FIG. 1C
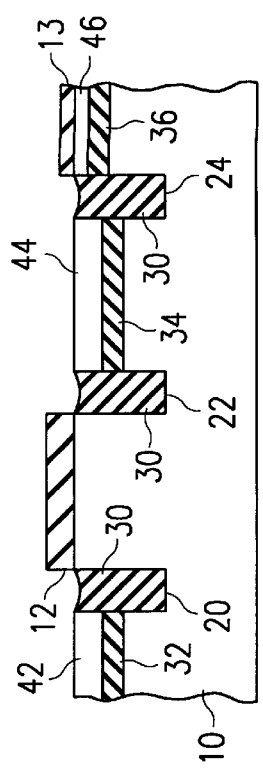
FIG. 1D
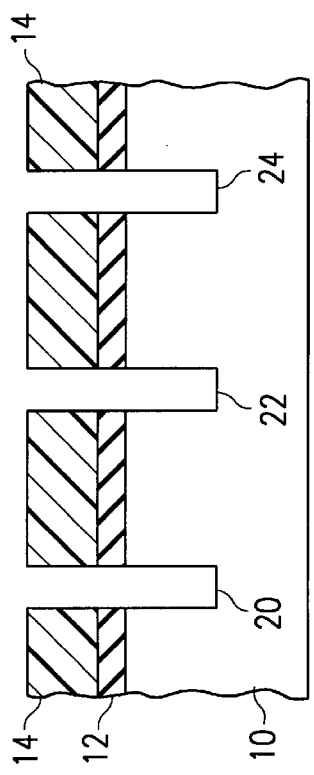
FIG. 1E
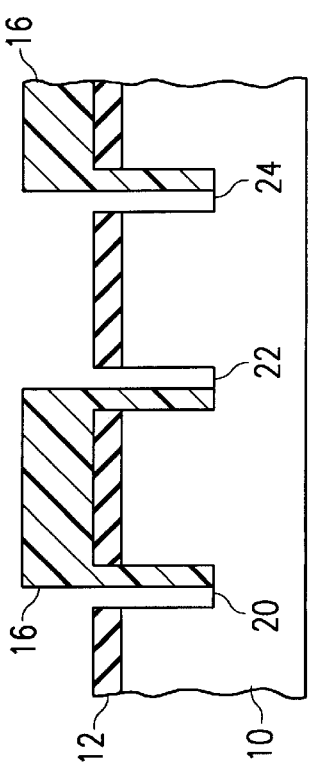
FIG. 1F

SILICON-ON-INSULATION TRENCH ISOLATION STRUCTURE AND METHOD FOR FORMING

RELATED APPLICATIONS

This application is related to co-pending U.S. Provisional Application No. 60/032,640 entitled Active Silicon-On-Insulator Region Isolation Structure and Method for Forming, filed on Dec. 9, 1996 (TI Docket No. TI-16767).

This invention was made with government support under F33615-89-C-5714 awarded by the United States Air Force. The government has certain rights in this invention.

TECHNICAL FIELD OF THE INVENTION

This invention relates generally to the field of semiconductor devices and more particularly to a silicon-on-insulator trench isolation structure and method for forming the same.

BACKGROUND OF THE INVENTION

The fabrication of silicon-on-insulator ("SOI") substrates or wafers using separation by implantation of oxygen ("SIMOX") involves the implantation of oxygen ions into a silicon bulk substrate to create a buried insulator layer or buried oxide layer ("BOX") below the upper surface of the silicon bulk substrate. As a result, an active SOI region is formed in the single-crystalline silicon bulk substrate located above the BOX. This area may be referred to as an SOI layer or film. The SIMOX process generally involves three steps: (1) cleaning a standard silicon wafer; (2) implanting oxygen ions under the surface of the wafer or substrate using a relatively high energy ion beam at around 200 keV at a dose of $O^+$ of around $2 \times 10^{18}/cm^2$; and (3) annealing the wafer at a high temperature that is greater than around 1300° C. for around six hours to help remove damage caused by the oxygen ion implantation.

SIMOX is generally the preferred process for building SOI substrates or wafers. SOI substrates can be used, for example, in very large scale integration ("VLSI") devices and ultra large scale integration ("ULSI") devices. SOI substrates or wafers generally provide, for example, one or more of the following advantages over bulk silicon wafers: (1) better radiation hardness; (2) higher speed performance; (3) higher temperature operations; (4) lower power devices; (5) lower cost process for some applications; and (6) easier implementation of submicrometer design rules. Furthermore, patterned SOI substrates or wafers provide additional advantages that include the ability to fabricate devices made from different technologies on a single substrate. This may include the implementation of smart power devices, mixed signal devices, and other devices that would require a high voltage isolation.

The fabrication of patterned SOI substrates or wafers using SIMOX involves the selective implantation of oxygen ions into a silicon bulk substrate to produce active SOI regions and active bulk substrate regions. The active SOI regions are formed above a buried oxide layer ("BOX") that is formed as a result of the implantation of oxygen ions. Active SOI regions include an SOI film or layer of single-crystalline silicon that is present between the upper surface of the BOX and the upper surface of the silicon bulk substrate. However, the implantation of oxygen ions damages the silicon bulk substrate. Of particular interest are damaged areas created in the bulk substrate that are located in transition regions between active SOI regions and active bulk substrate regions. As a result, devices may not be fabricated in the damaged areas resulting in a significant amount of unavailable or non-productive wafer area. This reduces overall integrated circuitry density.

The BOX, present in each active SOI region, has an upper and a lower surface and sides. The formation of the BOX below the surface of the silicon bulk substrate generates internal stresses due to the uneven expansion of the BOX during the SIMOX process. These internal stresses result in crystalline dislocations extending outwardly from all sides of the BOX which result in the formation of the damaged areas. Normally, the SOI wafer is annealed after oxygen implantation which allows certain crystalline dislocations to be removed. However, the crystalline dislocations extending outwardly from the sides of the BOX and extending into both the active SOI region and the adjacent active bulk substrate region will not be removed by annealing. As a result of the implantation of oxygen ions the transition region between an active SOI region and an active bulk substrate region is characterized by a large number of crystalline dislocations which define the damaged area. The damaged area extends into both the active SOI region and the active bulk substrate region and is not suitable for fabricating devices. These crystalline dislocations cause undesirable leakage currents. Hence, the overall circuitry design must provide for sufficient device spacing to avoid the damaged areas. This significantly reduces overall wafer or die area available for device fabrication.

In some situations, it is also desirable to fabricate an SOI substrate with adjacent active SOI regions with BOXs formed at different depths below the surface of the silicon bulk substrate. In such a case, unremovable crystalline dislocations may also occur in the transition regions between the active SOI regions resulting in the formation of damaged areas which also significantly reduce overall usable wafer or die area and overall integrated circuitry density.

SUMMARY OF THE INVENTION

From the foregoing it may be appreciated that a need has arisen for a silicon-on-insulator trench isolation structure and method for forming the same that eliminate or reduce the problems described above. In accordance with the present invention, a silicon-on-insulator trench isolation structure and method for forming the same are provided to relieve the internal bulk substrate stresses created during the formation of a buried insulator layer while fabricating a patterned SIMOX substrate. The reduction in the internal stresses prevent or reduce the formation of crystalline dislocations which define a damaged area that reduces overall circuitry density. Thus, overall wafer or die density may be significantly increased due to the elimination of the damaged area at the junction between two active areas, such as between an active SOI region and an active bulk substrate region or between two active SOI regions with BOX's at different depths.

According to an embodiment of the present invention, a silicon-on-insulator trench isolation structure is provided that includes an active silicon-on-insulator region, an active bulk substrate region, and a trench region positioned between the active silicon-on-insulator region and the active bulk substrate region. The active silicon-on-insulator region includes a silicon-on-insulator film positioned above a buried insulator layer. Thus, adjacent microelectronic devices may be fabricated on the active silicon-on-insulator region and the active bulk substrate region without having to provide large spacing regions between such devices.

The present invention provides various technical advantages. A technical advantage of the present invention includes the reduction or elimination of crystalline dislocations caused by the formation of a BOX within a silicon bulk substrate. This increases overall wafer or die area that is available for device fabrication, and hence, overall integrated circuitry density is significantly increased. Another technical advantage of the present invention includes the ability to use existing trench fabrication technology and techniques to fabricate the trench structure of the present invention. Yet another technical advantage of the present invention includes the ability to use existing SIMOX implantation methods and techniques to create a patterned SOI substrate of the present invention. Another technical advantage includes the ability to fabricate adjacent SOI devices having buried insulator layers or BOXs positioned at different depths from the upper surface of the silicon bulk substrate. This may be accomplished without having to waste considerable substrate area due to device spacing requirements caused by crystalline dislocations in the transition region between SOI active regions. Other technical advantages are readily apparent to one skilled in the art from the following FIGUREs, description and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts or similar areas, in which:

FIGS. 1A through 1F are a series of schematic cross-sectional diagrams illustrating one embodiment of a silicon-on-insulator trench isolation structure and method for forming the same.

DETAILED DESCRIPTION OF THE INVENTION

FIGS. 1A through 1F are a series of schematic cross-sectional diagrams illustrating one embodiment of the fabrication of a silicon-on-insulator trench isolation structure of the present invention. Referring now to FIG. 1A, a bulk substrate 10 is shown with a blocking layer 12 provided on its upper surface. Bulk substrate 10 will generally be a single crystalline or mono-crystalline silicon substrate and blocking layer 12 may be provided as an amorphous insulator such as silicon dioxide ("$SiO_2$"). Blocking layer 12 may be formed using conventional oxidation or deposition techniques. The deposition techniques may include any known or available deposition technique such as chemical vapor deposition, plasma enhanced chemical vapor deposition, physical vapor deposition, evaporation, and laser ablation.

Referring now to FIG. 1B, a photoresist layer 14 is applied to the upper surface of blocking layer 12. This may be accomplished using any known or conventional technique such as by spinning the substrate and applying photoresist layer 14. A mask or pattern is then applied to the surface of photoresist layer 14 to differentiate between the portions of photoresist layer 14 that are provided over active regions, including both active SOI regions and active bulk substrate regions of bulk substrate 10, and those portions that are provided over trench regions. For example, as shown in FIG. 1B, the portions of photoresist layer 14 that are located above a trench region 20, a trench region 22, and a trench region 24 are removed.

After the portions of photoresist layer 14 residing above the trench regions are stripped and removed, trench region 20, trench region 22, and trench region 24 are formed using an anisotropic etching technique. The anisotropic etching technique may be any available or conventional etching technique such as dry etching or wet etching, and preferably will be an anisotropic plasma etch technique that proceeds generally in a downward direction as illustrated in FIG. 1B. However, the present invention is not limited to anisotropic etching but may also include isotropic etching such that etching occurs in all directions in approximately equal amounts. Isotropic etching can proceed in all directions at the same rate while anisotropic etching is, by definition, any etching that is not isotropic. Alternatively, the etching technique used to form trench region 20, trench region 22, and trench region 24 may include the introduction of nitric acid ("$HNO_3$") and hydrofluoric acid ("HF") to dissolve away the regions of blocking layer 12 that were positioned above trench region 20, trench region 22, and trench region 24. The $HNO_3$ and HF then dissolves away portions of the single crystalline silicon of bulk substrate 10 to form trench region 20, trench region 22, and trench region 24. The remaining portions of photoresist layer 14 is then removed.

Referring next to FIG. 1C, a photoresist layer 16 is applied to the surface of blocking layer 12 and the exposed trench regions as shown. Photoresist layer 16 is then masked and selectively stripped using conventional photolithographic techniques to expose desired areas of the trench regions and bulk substrate 10. The portions of photoresist layer 16 that remain are positioned above active regions of bulk substrate 10 that will later define either an active bulk substrate region or an active SOI region. Microelectronic devices may be fabricated using the active SOI region and the active bulk substrate region.

The exposed portions of blocking layer 12 are then etched using any available or conventional etching technique to remove the exposed portions of blocking layer 12. Photoresist layer 16 is then stripped and removed and a trench fill material 30 is then applied over the surface of the remaining structure. This results in trench region 20, trench region 22, and trench region 24 filled with trench fill material 30 until they are relatively full. Trench fill material 30 will generally be an insulator such as $SiO_2$, $SiN_4$, and $SiO\ N_{xy}$, or other amorphous materials including low K dielectrics. Trench material fill 30 will preferably be an amorphous material that has flow characteristics so that when a later SIMOX implant occurs, trench fill material 30 will allow internal stresses from within bulk substrate 10 to be relieved. In the preferred embodiment, trench region 20, trench region 22, and trench region 24 will be filled with trench fill material 30; however, the present invention may be practiced without the presence of any trench fill material 30.

Referring next to FIG. 1D, trench fill material 30 is etched using successive etching and masking procedures to obtain the profile shown in FIG. 1D. Preferably, an anisotropic plasma etch is performed so that all of trench fill material 30 is removed from the planar surfaces and a substantial portion of trench fill material 30 remains within the trench regions. The portion of blocking layer 12, previously provided between trench region 22 and trench region 24, is removed. The thickness of the remaining portion of blocking layer 12, between trench region 20 and trench region 22, is greater than the thickness of a blocking layer 13 that is provided above and to the right of trench region 24. The reason for the different thicknesses will be discussed below. Blocking layer 13 may be provided at a thickness that is less than the thickness of the remaining portion of block layer 12 through the use of conventional photolithographic techniques to expose and etch the desired areas. In effect, blocking layer 13 may be formed by etching a portion of the prior blocking layer 12 that was present, or by a combination of etching and re-deposition or regrowth. By etching trench fill material 30 after performing the trench fill, trench fill material 30 may be etched from the upper surface of bulk substrate 10 without etching or removing much of trench fill material 30 from the trench regions. As mentioned previously, trench fill material 30 provides stress relief from within bulk substrate 10 when the BOXs are fabricated in a later step.

Referring next to FIG. 1E, a SIMOX implant is performed by implanting oxygen ions. The SIMOX implant will typically be performed at a temperature of above approximately 600° C. and at an electron-volt level of approximately 190 keV. The oxygen ions may be provided at a dosage or density of $1.8 \times 10^{18}$ $O^+/cm^2$. As can be seen in FIG. 1E, the result of the oxygen ion implantation is the creation of a buried insulator layer 32, a buried insulator layer 34, and a buried insulator layer 36. A buried insulator layer is sometimes referred to as a buried oxide layer or BOX. The thickness of each BOX will generally be provided at a thickness of around 380 nanometers, but sometimes significantly less.

The regions above each of the buried insulator layers or BOXs define a silicon-on-insulator or SOI active region. These active SOI regions are shown in FIG. 1E as an SOI film 42, an SOI film 44, and an SOI film 46. These active SOI regions are provided as single-crystalline silicon, assuming that bulk substrate 10 is provided as a single-crystalline silicon. The SIMOX implantation procedure has a minimal effect on trench region 20, trench region 22, and trench region 24. The oxygen ion implantation results in crystalline damage and crystalline dislocations that are above and below buried insulator layer 32, buried insulator layer 34, and buried insulator layer 36. The trench regions provide stress relief as the BOXs grow during oxygen ion implantation which reduces or prevents the formation of crystalline dislocations extending between active regions.

As illustrated, an active bulk substrate region within bulk substrate 10, which is located between trench region 20 and trench region 22, does not develop a buried insulator layer due to the relative thickness of the portion of blocking layer 12 provided above on the upper surface of bulk substrate 10. If the thickness of the blocking layer is sufficient to prevent the oxygen ion implantation from entering bulk substrate 10, no buried insulator layer is created. The active bulk substrate region is now available for the fabrication of any device such as a transistor. Thus, active SOI regions and active bulk substrate regions are provided next to one another so that different types of devices, such as transistors, may be fabricated on the same wafer within close proximity to one another. The width of the spacing between trench regions is significantly less than the width of the damaged areas that develop in the absence of the trench regions. As mentioned before, this results in a significant increase in available wafer area for circuitry fabrication.

FIG. 1E also illustrates the condition where the blocking layer is not of sufficient thickness to prevent ion implantation but is sufficiently thick to reduce the depth of the BOX formation. For example, the relative thin portion of blocking layer 13 that is provided above bulk substrate 10 is not of sufficient thickness to fully inhibit the formation of buried insulator layer 36. However, the thickness of blocking layer 13 reduces the depth from the surface of bulk substrate 10 in which buried insulator layer 36 is formed. As is illustrated, the thickness of buried insulator layer 32, buried layer 34, and buried insulator layer 36 are approximately the same thickness because of the same or similar oxygen ion dosages; however, buried insulator layer 36 is formed closer to the surface of bulk substrate 10. This results in a thinner SOI film 46 as compared to either SOI film 42 or SOI film 44. The thickness of SOI film 42 and SOI film 44 will generally be provided at around 210 nanometers while the thickness of SOI film 46 will be at some lesser thickness. However, it should be understood that even though general thicknesses are specified, the present invention is in no way limited to any one particular thickness.

The formation of the active SOI region, defined by SOI film 46, and the adjacent active SOI region, defined by SOI film 44, illustrates the case in which two SIMOX structures having BOXs at different depths may be fabricated adjacent to one another. Trench region 24 provides stress relief between the two active SOI regions preventing crystalline dislocations, and thus allowing the formation of the two active SOI regions within close proximity to one another. The width of the trench regions, such as trench region 20, trench region 22, or trench region 24 may be provided at any desirable width but will preferably be provided at a constant, submicron width for all trench regions. The trench regions could be provided at variable widths depending upon such factors as die or circuitry layout.

Referring now to FIG. 1F, the entire wafer or structure is annealed to recover the crystalline quality of bulk substrate 10. The annealing process is performed at around 1300° C. The crystalline quality of SOI film 42, SOI film 44, and SOI film 46 is recovered to a sufficient quality from the crystalline damage caused by the oxygen ion implantation. However, and as was mentioned previously, in the absence of a trench region between adjacent active regions, crystalline dislocations would extend from the sides of the buried insulator layers to create a damaged area that cannot be used for fabricating semiconductor devices. These types of crystalline dislocations would not be recovered through the annealing process. As a result of the annealing process, buried insulator layer 32, buried insulator layer 34, and buried layer 36 generally increase in thickness as oxygen molecules are combined within the buried insulator layers to form additional $SiO_2$ molecules. As is shown, the thickness of SOI film 42, SOI film 44, and SOI film 46 will slightly decrease in thickness due to the annealing process.

Next, the remaining portions of blocking layer 12 and blocking layer 13 are etched from the surface of bulk substrate 10 so that most or all of blocking layer 12 and blocking layer 13 is removed. As a result, the only remaining $SiO_2$ is the trench fill material 30 that is provided within trench region 20, trench region 22, and trench region 24. At this point, SOI devices may be fabricated in the SOI active regions defined by SOI film 42, SOI film 44, and SOI film 46. Similarly, bulk substrate devices may be fabricated in the silicon bulk substrate active regions of the wafer, such as the one shown in FIG. 1F between trench region 20 and trench region 22. Overall, the SOI trench isolation structure results in substantial die or wafer savings and allows for significantly denser overall integration because of the elimination of the damaged areas which occur at the transitions between active bulk substrate regions and active SOI regions, and between active SOI regions with buried insulator layers of different depths. This allows microelectronic devices, such as field-effect transistors and other types of transistors, to be fabricated on the same wafer and within fairly close proximity to each other.

As previously mentioned, trench region 20, trench region 22, and trench region 24 provide stress relief between active regions and prevent the formation of crystalline dislocations that occur using other techniques. It should be noted that trench region 20, trench region 22, and trench region 24 may be constructed or fabricated with relatively straight walls, tapered walls, or with any desired profile. The key feature of the trench region is to provide stress relief at the transition regions between active regions. It should also be understood that although in the preferred embodiment the trench regions are filled with trench fill material 30, this is not an absolute requirement and it is believed that the absence of trench fill material 30 still provides substantial overall benefits in the reduction or elimination of crystalline dislocations caused by the SIMOX process. The depth of the trench regions may vary and will generally be provided around or below the corresponding buried insulator layer. Preferably, the trench regions will be provided at a depth that extends below the BOX to a depth greater than any damaged area that may be created due to internal stresses. Also, the trench regions may be fabricated before blocking layer 12 is ever applied.

Thus, it is apparent there has been provided, in accordance with the present invention, a silicon-on-insulator trench isolation structure and method for forming the same that satisfy the advantages set forth above. The present invention eliminates or reduces the internal stresses that cause the crystalline dislocations between active device regions and which are caused by the development of a buried insulator layer within a silicon bulk substrate. Although the preferred embodiment has been described in detail, it should be understood that various changes, substitutions, and alterations can be made herein without departing from the scope of the present invention. For example, although the structure of the present invention has been illustrated and described using conventional semiconductor fabrication techniques, other techniques, whether currently known or not, could potentially be used to fabricate the silicon-on-insulator trench isolation structure of the present invention. Also, some of the steps described and illustrated in the preferred embodiment as discrete or separate steps may be combined into one step without departing from the scope of the present invention. Other examples of changes, substitutions, and alterations are readily ascertainable by one skilled in the art and could be made without departing from the spirit and scope of the present invention as defined by the following claims.

What is claimed is:

1. A method of forming a silicon-on-insulator trench isolation structure within a bulk silicon substrate, the method comprising the steps of:

providing a bulk silicon substrate;

forming a blocking layer on the upper surface of the bulk silicon substrate having a pattern to define thereunder in said bulk silicon substrate an active silicon-on-insulator region, a further active region, and a trench region within the bulk silicon substrate, the trench region positioned between the active silicon-on-insulator region and the further active region, the ability of the blocking layer to transmit selected ions capable of forming an insulator with silicon therethrough being less over the further active region than over the active silicon-on-insulator region;

etching portions of the bulk silicon substrate to form the trench region between said further active region and said active silicon-on-insulator region;

then implanting said selected ions capable of forming an insulator with silicon into the blocking layer at an energy level such that said ions either only pass through the portion of said blocking layer having greater ability to transmit said selected ions therethrough or pass through said the portion of said blocking layer having greater ability to transmit said selected ion therethrough to a greater depth in said bulk silicon substrate than through the portion of said blocking layer disposed over said further active area to form a buried insulator layer at a desired location and at a desired depth below the upper surface of the bulk silicon substrate in said active silicon-on-insulator region;

removing the blocking layer; and annealing the structure, including the bulk silicon substrate, to form the silicon-on insulator trench isolation structure.

2. The method of claim 1, wherein the step of etching portions of the bulk silicon substrate step is performed before the step of forming a blocking layer.

3. The method of claim 2, further comprising the step of filling the trench region with a trench fill material after the step of etching portions of the bulk silicon substrate to define the trench region, and the step of forming a blocking layer includes the step of etching any excess trench fill material to form the blocking layer having the desired contour.

4. A method of forming a silicon-on-insulator trench isolation structure within a bulk silicon substrate, the method comprising the steps of:

providing a bulk silicon substrate;

forming a patterned trench region extending into said bulk silicon substrate;

then implanting ions capable of forming an insulator with silicon into the bulk silicon substrate;

then annealing the structure, including the bulk silicon substrate, to form the buried silicon-on insulator trench isolation structure on one side of said trench; and then completing fabrication of a silicon-on-insulator semiconductor device over said buried insulator and completing forming a further semiconductor device on an opposing side of said trench.

5. The method of claim 4 further including the step of filling said trench region with an electrically insulating material.

6. The method of claim 5 wherein said step of filling said trench region with an electrically insulating material is provided prior to said step of implanting.

7. The method of claim 4 further including the steps of providing a blocking layer on a surface of said bulk silicon substrate prior to said step of implanting ions while causing predetermined portions of said blocking layer to have reduced thickness relative to other portions of said blocking layer.

8. The method of claim 5 wherein said step of implanting ions into the bulk silicon substrate forms a buried insulator layer at desired locations beneath a region of said blocking layer having reduced thickness and at a depth above said depth of said trench.

9. The method of claim 2 wherein said trench region extends below said buried insulator layer.

10. A method for forming a silicon-on-insulator trench isolation structure within a bulk silicon substrate, the method comprising the steps of:

providing a bulk silicon substrate;

forming a blocking layer on the upper surface of the bulk silicon substrate having a pattern to define thereunder in said bulk silicon substrate an active silicon-on-insulator region, a further active region, and a trench region within the bulk silicon substrate, the trench region positioned between the active silicon-on-insulator region and the further active region, the ability of the blocking layer to transmit selected ions capable of forming an insulator with silicon therethrough being greater over the further active region than over the active silicon-on-insulator region;

etching portions of the bulk silicon substrate to define the trench region between said further active region and said active silicon-on-insulator region;

then implanting said selected ions capable of forming an insulator with silicon into the blocking layer at an energy level such that said ions either only pass through the portion of said blocking layer having greater ability to transmit said selected ions therethrough or pass through said the portion of said blocking layer having greater ability to transmit said selected ion therethrough to a greater depth in said bulk silicon substrate than through the portion of said blocking layer disposed over said further active area;

removing the blocking layer; and annealing the structure, including the bulk silicon substrate to form a buried insulator layer at a desired location and at a desired depth below the upper surface of the bulk silicon substrate in said active silicon-on-insulator region and to form the silicon-on insulator trench isolation structure.

11. The method of claim 10, wherein the step of etching portions of the bulk silicon substrate step is performed before the forming a blocking layer step.

12. The method of claim 11, further comprising the step of filling the trench region with a trench fill material after the step of etching portions of the bulk silicon substrate to define the trench region, and the step of forming a blocking layer includes the step of etching any excess trench fill material to form the blocking layer having the desired contour.

13. The method of claim 4 wherein, during said step of implanting, essentially no ions pass through said blocking layer to said further active area.

14. The method of claim 4 wherein, during said step of implanting, said ions pass through said blocking layer to a greater depth in said silicon-on-insulator region than in said further active region.

15. The method of claim 4 wherein, during said step of implanting, said ions pass through said blocking layer to a greater depth in said further active region than in said silicon-on-insulator region.

* * * * *